United States Patent [19]

Baker et al.

[11] Patent Number: 4,863,834

[45] Date of Patent: Sep. 5, 1989

[54] SILICON-CONTAINING POLYMERS AS RESISTS

[75] Inventors: Gregory L. Baker, Bridgewater Township, Somerset County; Murrae J. S. Bowden, Summit; Antoni S. Gozdz, Tinton Falls; Cynthia F. Klausner, Iselin, all of N.J.

[73] Assignee: Bell Communications Research, Inc., Livingston, N.J.

[21] Appl. No.: 79,661

[22] Filed: Jul. 31, 1987

[51] Int. Cl.[4] .................. G03C 1/495; G03C 5/16; G03F 7/26
[52] U.S. Cl. ..................... 430/286; 430/326; 430/330; 525/326.5; 522/148
[58] Field of Search .............. 525/326.5; 430/326, 430/330, 286; 522/148

[56] References Cited

FOREIGN PATENT DOCUMENTS 61-105544  5/1986  Japan ............................. 430/286
62-115442  5/1987  Japan ............................. 430/286

OTHER PUBLICATIONS

Higashimura, T., et al, Polymer Journal, vol. 17, No. 2, pp. 395–398 (1985).

*Primary Examiner*—Paul R. Michl
*Assistant Examiner*—Cynthia Hamilton
*Attorney, Agent, or Firm*—James W. Falk; Edward M. Fink

[57] ABSTRACT

A sensitive deep utltraviolet radiation resist suitable for use in two layer lithography is obtained by brominating poly (1-trimethylsilylpropyne). Positive patterned layers are obtained by coating a substrate with the polymer, irradiating it with ultraviolet radiation, baking the polymer and developing the irradiated portions.

4 Claims, No Drawings

SILICON-CONTAINING POLYMERS AS RESISTS

This invention relates to ultraviolet radiation sensitive positive resists. More particularly, the present invention relates to brominated poly(1-trimethylsilylpropyne)s which are sensitive to ultraviolet radiation and are suitable for use as positive resists in a two-layer lithographic process.

The continuing trend toward higher resolution and smaller feature sizes in integrated circuitry has led to the development of multilayer resist processing techniques which are designed to achieve submicron resolution on topographical features. Heretofore, a variety of organosilicon polymers such as polysiloxanes and the polysilanes have been used for this purpose, either as the image transfer layer in a two-layer system or as an intermediate etch barrier in a three layer system. Interest in these materials for resist use has been premised upon their outstanding dry-etch resistance which results from the formation of a thin protective layer of refractory silicon dioxide at the surface of the polymer upon exposure to an oxygen plasma. It is this resistance to plasma etching that is a major requirement for high resolution lithography, particularly in two-layer applications.

Although patterns have been generated in these resists and transferred with high aspect ratios into the planarizing layer of a two-layer resist, difficulties have been encountered in attaining the required sensitivity to deep-ultraviolet radiation over the wavelength range from 200 to 300 nm. This limitation is particularly prevalent with positive resists. All positive, deep-ultraviolet radiation resists currently used for two-layer resist applications are limited by their low sensitivity. Examples of these materials include organosilicon derivatives of polymethacrylate, and the polysilanes. Although the use of these materials has met with some success, the overall lack of sensitivity, in combination with low etch resistance to oxygen plasma has led workers in the art to seek alternative materials.

In accordance with the present invention, the prior art limitations have been effectively obviated by a novel brominated poly(1-trimethylsilylpropyne) which has proven to be a sensitive, deep ultraviolet radiation resist suitable for use in two-layer lithography. The described resist absorbs radiation at less than 300 nm, while evidencing good resistance to an oxygen plasma and satisfactory thermal properties.

The resists described herein are prepared by brominating poly(1-trimethylsilylpropyne), a material which evidences excellent film-forming properties and good thermal stability.

The monomeric component of the polymer is obtained from conventional commercial sources and is polymerized in toluene in the presence of a transition metal halide at slightly elevated temperatures in accordance with the following equation:

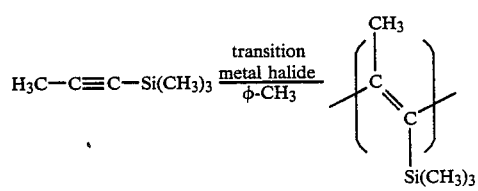

The polymer may conveniently be recovered in quantitative yield by precipitation in methanol and drying to constant weight.

Following, the polymer so obtained is brominated in a carbon tetrachloride solution with N-bromosuccinimide using a free radical initiator in accordance with the following equation:

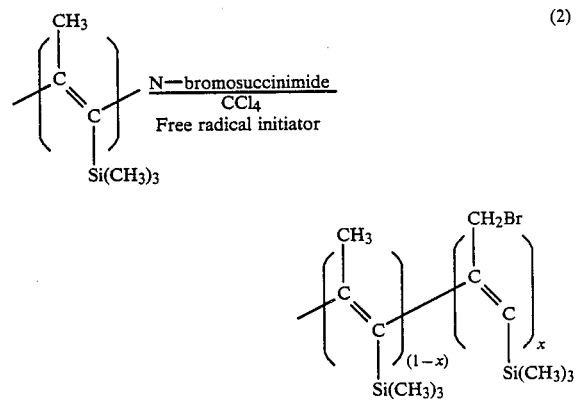

wherein x is in the range $0 < x < 0.7$. The polymer is recovered by precipitation into methanol followed by drying.

The polymer so obtained is now suitable for application to a substrate. This end is attained by initially dissolving the polymer in a suitable organic solvent, and depositing a coating thereof upon a suitable surface by conventional techniques, for example, spin coating. The solution so formed typically contains from 1–2 percent, by weight, of polymer. Suitable solvents, e.g., chlorobenzene, should evidence a boiling point below the decomposition point of the polymer so permitting the expeditious removal of the solvent from the coating by heat or vacuum drying. When the solvent is removed, there remains a uniform resist film of the polymer on the substrate. Films deposited may range in thickness up to 1.0 nm., specific thickness being determined by the concentration of polymer, molecular weight and spinning speed. Following, the resist films of the polymer prepared as described are selectively irradiated through a mask using a suitable deep-ultraviolet radiation light source.

Next, the exposed polymer is baked in an oven for a time period ranging from 15–120 minutes at elevated temperature, typically between 100°–160° C., the shorter time period corresponding to the higher temperatures and the converse. Heating at temperatures beyong 160° C. results in thermal degradation of the polymer. An optimum baking sequence is found to occur at a temperature of 140° C. for 1 hour. Failure to properly post-exposure bake the polymer impedes proper development and attainment of the desired sensitivity.

Next, the exposed resist is developed by conventional dipping or spraying techniques. Positive-resist action requires a developer (solvent) which disolves the irradiated portion of the film. Suitable solvents for this purpose include, for example, an alcohol such as butanol. The removal of the indicated portion of the resist leaves a three-dimensional positive-tone image of the mask in the resist suitable for subsequent processing, e.g., etching or deposition.

Although the sensitivity and resolution of the described resists are important, the ability of the resist to protect the underlying substrate during oxygen reactive-ion etching is also of importance because it is a critical requirement for two-layer lithographic applications. During reactive-ion etching, the resist is exposed to reactive oxygen species and various forms of radiative energy present in the plasma. The very high oxygen plasma resistance of the resists described herein makes them suitable for two-layer resist processes which employ oxygen reactive-ion etching pattern transfer techniques.

An example of the practice of the present invention is set forth herein below. It will be appreciated by those skilled in the art that the example is set forth solely for purposes of exposition and is not to be construed as limiting.

EXAMPLE

The example describes the preparation of the polymer of 1-trimethylsilylpropyne and the subsequent bromination thereof.

A 0.36M solution of monomeric 1-trimethylsilylpropyne in dried deoxygenated toluene was polymerized at 80° C. under oxygen-free conditions with 2 mol percent of tantatum pentachloride as the catalyst. The polymer was recovered in quantitative yield by precipitation into methanol followed by drying to constant weight. Two additional dissolution/precipitation steps were carried out to purify the polymer.

Following, the polymer was brominated in a 1 percent carbon tetrachloride solution using N-bromosuccinimide and azobisisobutyronitrile as a free radical initiator. This end was attained by adding 0.45 gram (2.6 m mol) of N-bromosuccinimide and 0.02 gram of azobisisobutyronitrile to a solution of 1.5 grams of poly(1-trimethylsilylopropyne) in 150 milliliters of carbon tetrachloride. The solution was refluxed under a nitrogen blanket for 4 hours, cooled, filtered through a 1.2 μm filter and the polymer recovered by precipitation into methanol followed by drying. The degree of bromination was determined by elemental analysis.

Next, a resist solution of the polymer was prepared in chlorobenzene and the polymer solution filtered through 0.5 μm Teflon filters. Films were then spin-coated on polished silicon wafers previously coated with a 1.5 μm thick layer of hard-baked planarizing material. Following, the coated wafer was baked for 15 minutes at 120° C.

The resist film so obtained was then exposed in air through a chromium or quartz mask using a deep-ultraviolet radiation source equipped with a 500 watt high-pressure Xe-Hg lamp, the exposure tool being equipped with a dichroic mirror system and optical system capable of delivering approximately 24 mW/cm$^2$ at 260±20 nm at the wafer plane. The exposed wafer was baked following exposure for 1 hour at 140° C. Samples were then developed by dipping in 1-butanol for 30 seconds at room temperature followed by drying. Oxygen reactive-ion etching pattern transfer was effected in a Cooke Vacuum model C-71-3 parallel plate RIE system operating at 13.56 MH$_z$ at a power density of 0.14 cm$^2$, a self bias of −350 watts, an oxygen pressure of 20 mtorr., and a oxygen flow rate of 10 sccm.

What is claimed is:

1. Deep ultraviolet sensitive positive resist comprising a partially brominated poly(1-trimethylsilylpropyne) of the general formula

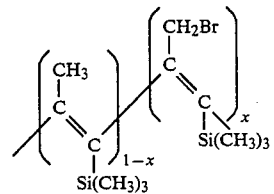

wherein x is in the range $0 < x < 0.7$.

2. Method for the formation of a positive patterned layer with a substrate comprising the steps of
   (a) coating the substrate with a composition obtained by partial bromination of poly(1-trimethylsilylpropyne), with N-bromosuccinimide,
   (b) irradiating selected portions of said composition with deep ultraviolet radiation,
   (c) baking the exposed composition for a time period ranging from 15–120 minutes at elevated temperature within the range of 100°–160° C., and
   (d) developing the irradiated portions of the coating.

3. Method in accordance with claim 2 wherein irradiation is effected with a source capable of delivering deep uv radiation shorter than 300 nm.

4. Method in accordance with claim 2 wherein development of the irradiated portion of the substrate is effected by C$_3$–C$_6$ alcohols preferably a C$_4$ alcohol.

* * * * *

UNITED STATES PATENT AND TRADEMARK OFFICE
CERTIFICATE OF CORRECTION

PATENT NO. : 4,863,834

DATED : September 5, 1989

INVENTOR(S) : Baker et al.

It is certified that error appears in the above-identified patent and that said Letters Patent is hereby corrected as shown below:

Column 4, line 49, change "alcohols preferably" to --alcohols.-- and delete rest of line.

Signed and Sealed this

Seventeenth Day of November, 1992

*Attest:*

DOUGLAS B. COMER

*Attesting Officer*      *Acting Commissioner of Patents and Trademarks*